(12) United States Patent
Yin et al.

(10) Patent No.: US 8,652,891 B1
(45) Date of Patent: Feb. 18, 2014

(54) SEMICONDUCTOR DEVICE AND METHOD OF MANUFACTURING THE SAME

(75) Inventors: Huaxiang Yin, Beijing (CN); Changliang Qin, Beijing (CN); Qiuxia Xu, Beijing (CN); Dapeng Chen, Beijing (CN)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 0 days.

(21) Appl. No.: 13/812,867

(22) PCT Filed: Aug. 27, 2012

(86) PCT No.: PCT/CN2012/001152
§ 371 (c)(1),
(2), (4) Date: Jan. 29, 2013

(30) Foreign Application Priority Data

Jul. 25, 2012 (CN) .......................... 2012 1 0260565

(51) Int. Cl.
*H01L 21/338* (2006.01)
(52) U.S. Cl.
USPC ........... 438/183; 438/300; 438/157; 438/283; 257/E21.454
(58) Field of Classification Search
USPC ........... 438/183, 300, 157, 283; 257/E21.454
See application file for complete search history.

(56) References Cited

U.S. PATENT DOCUMENTS

| 7,186,599 | B2 * | 3/2007 | Ahmed et al. ................. 438/157 |
| 7,833,889 | B2 * | 11/2010 | Pillarisetty et al. ........... 438/585 |
| 8,481,379 | B2 * | 7/2013 | Liang et al. ................... 438/183 |
| 2011/0260257 | A1 * | 10/2011 | Jagannathan et al. ........ 257/369 |
| 2011/0291190 | A1 * | 12/2011 | Xiao et al. .................... 257/347 |

FOREIGN PATENT DOCUMENTS

| CN | 1902741 | 1/2007 |
| CN | 102034863 | 4/2011 |

* cited by examiner

*Primary Examiner* — Bilkis Jahan
(74) *Attorney, Agent, or Firm* — Treasure IP Group (57) ABSTRACT

The present invention discloses a semiconductor device, comprising a plurality of fins located on a substrate and extending along a first direction; a plurality of gate stack structures extending along a second direction and across each of the fins; a plurality of stress layers located in the fins on both sides of the gate stack structures and having a plurality of source and drain regions therein; a plurality of channel regions located between the plurality of source and drain regions along a first direction; characterized in that the plurality of gate stack structures enclose the plurality of channel regions. In accordance with the semiconductor device and the method of manufacturing the same of the present invention, an all-around nanowire metal multi-gate is formed in self-alignment by punching through and etching the fins at which the channel regions are located using a combination of the hard mask and the dummy gate, thus the device performance is enhanced.

9 Claims, 6 Drawing Sheets

SEMICONDUCTOR DEVICE AND METHOD OF MANUFACTURING THE SAME

CROSS REFERENCE

This application is a National Phase application of, and claims priority to, PCT Application No.PCT/CN2012/001152, filed on Aug. 27, 2012, entitled 'SEMICONDUCTOR DEVICE AND METHOD OF MANUFACTURING THE SAME', which claimed priority to Chinese Application No. CN 201210260565.4, filed on Jul. 25, 2012. Both the PCT Application and Chinese Application are incorporated herein by reference in their entireties.

FIELD OF THE INVENTION

The present invention relates to a semiconductor device and a method of manufacturing the same, in particular, to a self-aligned multi-gate nanowire FET and a method of manufacturing the same.

BACKGROUND OF THE INVENTION

In the existing sub-20 nm technology, a three-dimensional multi-gate device (FinFET or Tri-gate) becomes the main device structure, and such a structure enhances the gate control capability and suppresses the current leakage and short-channel effects.

For example, as compared with the traditional single-gate bulk Si or SOI MOSFET, a dual-gate structured MOSFET can suppress the Short Channel Effect (SCE) and the Drain Induction Barrier Lower (DIBL) effect, has lower junction capacitance, can realize light channel doping, can adjust a threshold voltage by setting the work function of the metal gate to obtain about twice the drive current, thus reduces the requirement on Equivalent Oxide Thickness (EOT). However, a tri-gate device has a much stronger gate control capability as compared with a dual-gate device since the gate encloses the top surface and the two sides of the channel region. Further, an all-around nanowire multi-gate device has more advantageous.

Generally, nanowire three-dimensional multi-gate devices shall be integrated with the metal gate last process to keep the performance advantage. However, the process for manufacturing nanowire three-dimensional multi-gate devices is rather complicated and is not compatible with the mainstream process, particularly it is difficult to use the popular MG (gate of metallic materials)/HK (gate insulating layer of high-K materials) gate stack structure, which restricts the capability of the three-dimensional multi-gate devices to improve the device performance.

SUMMARY OF THE INVENTION

As stated above, the present invention aims to overcome the above technical difficulty and to manufacture self-aligned metal multi-gate nanowires.

Therefore, the present invention provides a semiconductor device, comprising a plurality of fins located on a substrate and extending along a first direction; a plurality of gate stack structures extending along a second direction and across each of the fins; a plurality of stress layers located in the fins on both sides of the gate stack structures and having a plurality of source and drain regions therein; a plurality of channel regions located between the plurality of source and drain regions along a first direction; characterized in that the plurality of gate stack structures enclose the plurality of channel regions.

Wherein the material for the fins is different from that for the stress layers.

Wherein the fins and/or the stress layers are made of a material selected from Si, SiGe, SiSn, GeSn, Si:C, Si:H and SiGe:C, or combinations thereof.

Wherein each of the gate stack structures comprise a gate insulating layer formed of high-K materials and a gate conductive layer formed of metallic materials.

Wherein the gate stack structures below the channel regions have a sectional shape of one of Σ, C, and D or combinations thereof along a second direction.

Wherein the stress layers and/or the source and drain regions comprise one of SiGe, SiSn, GeSn, Si:C, Si:H and SiGe:C, or combinations thereof.

The present invention also provides a method of manufacturing a semiconductor device, comprising forming a plurality of fins extending along a first direction on a substrate and a hard mask layer over the fins; forming a plurality of dummy gate stack structures extending along a second direction and across each of the fins; forming stress layers in the fins on both sides of the dummy gate stack structures and source and drain regions in the stress layers; depositing an interlayer dielectric layer to overlap the fins, the stress layers, and the dummy gate stack structures; removing the dummy gate stack structures, thereby forming first gate trenches in the interlayer dielectric layer to expose the hard mask layer; etching the fins below the hard mask layer to form second gate trenches, wherein the fins between the second gate trenches and the hard mask layer form channel regions; and performing a deposition in the first and second gate trenches to form a plurality of gate stack structures that enclose the plurality of channel regions.

Wherein the material for the fins is different from that for the stress layers.

Wherein the fins and/or the stress layers are made of a material selected from Si, SiGe, SiSn, GeSn, Si:C, Si:H and SiGe:C, or combinations thereof.

Wherein each of the gate stack structures comprise a gate insulating layer formed of high-K materials and a gate conductive layer formed of metallic materials.

Wherein the second gate trenches have a sectional shape of one of Σ, C, and D or combinations thereof along a second direction.

Wherein the stress layers and/or the source and drain regions comprise one of SiGe, SiSn, GeSn, Si:C, Si:H and SiGe:C, or combinations thereof.

Wherein after forming the second gate trenches, the method further comprises: performing etching to remove the hard mask layer.

Wherein each of the dummy gate stack comprises a pad oxide layer and a dummy gate layer.

Wherein the step of forming stress layers and source and drain regions therein further comprises: forming gate spacers on the fins on both sides of the dummy gate stack structures along a first direction; performing etching in the fins on both sides of the gate spacers to form source and drain trenches; performing an epitaxial deposition in the source and drain trenches to form stress layers; and while or after forming the stress layers, performing doping to form source and drain regions in the stress layers.

In accordance with the semiconductor device and the method of manufacturing the same of the present invention, an all-around nanowire metal multi-gate is formed in self-alignment by punching through and etching the fins at which the channel regions are located using a combination of the hard mask and the dummy gate, thus the device performance is enhanced.

BRIEF DESCRIPTION OF THE DRAWINGS

The technical solution of the present invention will be described in detail with reference to the drawings below, wherein:

FIG. 1 (FIG. 1A and FIG. 1B) to FIG. 8 (FIG. 8A and FIG. 8B) are diagrammatic cross-sections in accordance with the steps of the method for manufacturing a FinFET of the present invention, wherein FIGS. 1A-8A are cross sectional views along a direction parallel to the channel, and FIGS. 1B-8B are cross sectional views along a direction perpendicular to the channel.

DETAILED DESCRIPTION OF THE EMBODIMENTS

The features and the technical effects of the technical solution of the present application will be described in detail in combination with the illustrative embodiments with reference to the drawings, and disclosed herein a FinFET for enhancing the carrier mobility in the channel region effectively to increase the device drive capability and a method of manufacturing the same. It should be pointed out that like reference signs indicate like structures, the terms such as "first", "second", "above", "below" used in the present invention may be used to modify various device structures or manufacturing processes. Except for specific explanations, these modifications do not imply the spatial, sequential or hierarchical relationships of the structures of the modified device or the manufacturing processes.

Figure 8A:
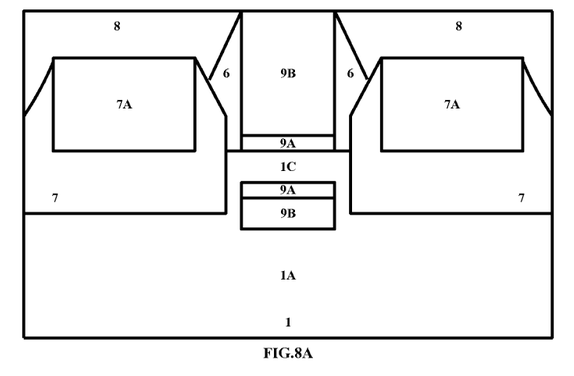
Figure 8B:
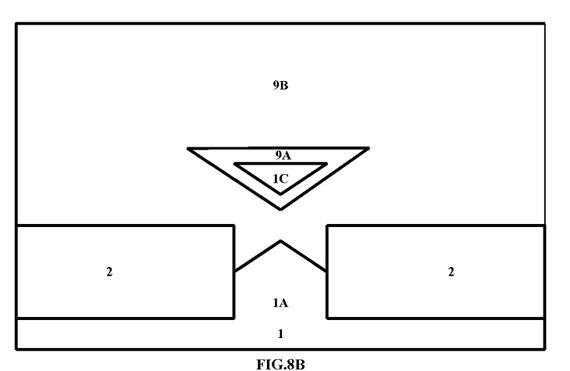
Figure 9:
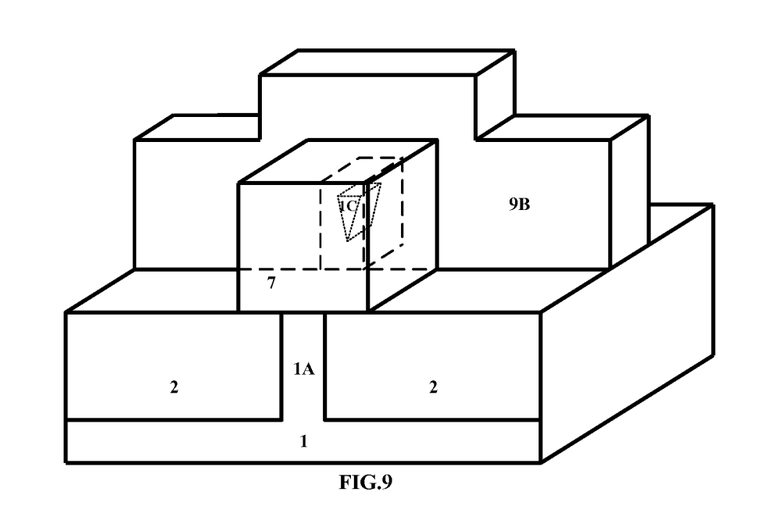
FIG. 9 is a block diagram of a FinFET device structure in accordance with the present invention.

FIG. 9 is a block diagram of a FinFET manufactured in accordance with the present invention, wherein the FinFET comprises a plurality of fins extending along a first direction, a plurality of metal gates extending along a second direction and across each of the fins, a plurality of source and drain regions on the fins on both sides of the metal gates, a plurality of channel regions located between a plurality of source and drain regions, wherein the metal gates enclose the channel regions. The cross-sectional views for the manufacturing method will be described with reference to FIGS. 1 to 8, and the device structure of FIG. 9 will then be further described in detail below.

Particularly, FIGS. 1A-8A are cross sectional views along a direction parallel to the channel in FIG. 9 (along a first direction), and FIGS. 1B-8B are cross sectional views along a direction perpendicular to the channel in FIG. 9 (along a section direction) herein below.

Figure 1A:
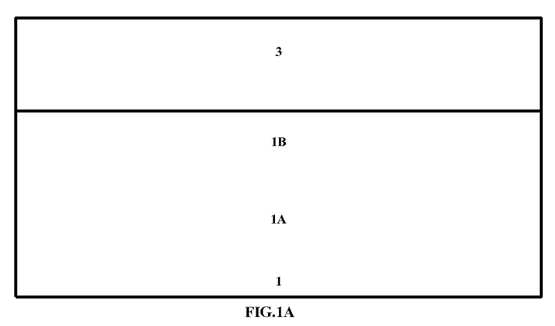
Figure 1B:
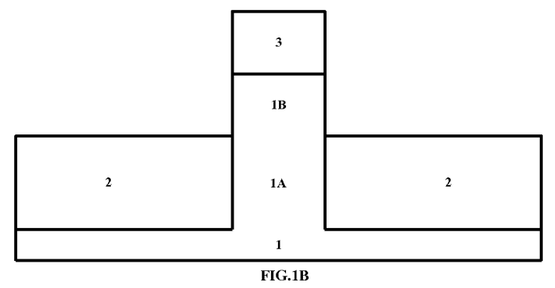

Referring to FIG. 1A and FIG. 1B, at least one fin structure extending along a first direction and a hard mask layer is formed. There is provided a substrate 1, which may be reasonably selected depending on the usage requirement of device and may comprise one of monocrystalline bulk silicon (Si), silicon-on-insulator (SOI), monocrystalline bulk germanium (Ge), germanium-on-insulator (GeOI), strained Si, and SiGe, compound semiconductor materials such as GaN, GaAs, InP, InSb, or carbon-based semiconductors such as graphene, SiC, and carbon nano tube. Under the consideration of compatibility with CMOS technology, preferably the substrate 1 is formed of bulk Si. The substrate 1 is performed photolithography/etching to form therein a plurality of trenches distributed in parallel along a first direction, then an insulating isolation dielectric layer made of silicon oxide or silicon oxynitride etc. is deposited in the trenches by a process such as PECVD, HDPCVD, and rapid thermal oxidation (RTO), to thereby form shallow trench isolations $(STI)_2$. The substrate 1 between STIs 2 constitutes a fin substrate 1A and a fin channel 1B. Preferably, the fin substrate 1A and the fin channel 1B are the same substrate and are simultaneously formed in the STI etch process. The substrate 1A may be doped to isolate the electrical influence between the channel and the substrate. STIs 2 may have a space (that is, the width of the fin substrates 1A and 1B) of about, e.g., 2-50 nm, and may have a height of about, e.g., 5-500 nm. In another way, an epitaxial fin 1B is epitaxially grown on the fin substrate 1A by a process such as UHVCVD, MOCVD, MBE, ALD, and atmospheric pressure epitaxy. The epitaxial fin 1B may be made of the same material as that for the substrate 1 (1A), e.g., both of them are made of Si, or made of other high mobility materials such as Ge, SiGe, SiGe:C, Si:C, Si:H, SiSn, GeSn, GaAs, InP, GaSb, InAs, and InSb. In order to be compatible with the COMS technology and the mainstream HK/MG technology, the epitaxial fin 1B is preferably made of one of Si, SiGe, SiGe:C, Si:C, Si:H, SiSn, and GeSn, and preferably Si. One fin substrate 1A and one fin channel (or the epitaxial fin) 1B may constitute one fin structure together. Wherein, although FIG. 1 only provides one fin for illustration, actually a plurality of parallel fins may be formed so that the drive capability and the gate control capability of the device may be enhanced. Similarly, the following figures also show one fin only, which, however, is not limited thereto. Furthermore, the at least one fin structure may also be formed by a method of etching the substrate 1 to form a deeper trench, filling insulating dielectric material and leaving at least one vertical protruding fin structure; or performing etching in the SOI substrate to form a trench that penetrates the buried oxide layer to reach the base Si layer, epitaxially growing Si in the trench, then performing selective etching to remove the top Si layer outside the trench area. Thereafter, a hard mask layer 3 is formed by first deposition on the fin structures 1A/1B by a conventional process such as LPCVD, PECVD, HDPCVD, MOCVD, MBE, ALD, evaporation and sputtering and subsequent etching, the material of which is different from that for STIs 2, the substrate 1 and the fin structures 1A/1B, and may be made of, e.g., one of silicon nitride, silicon oxynitride, and Diamond Like Carbon (DLC), or combinations thereof.

Figure 2A:
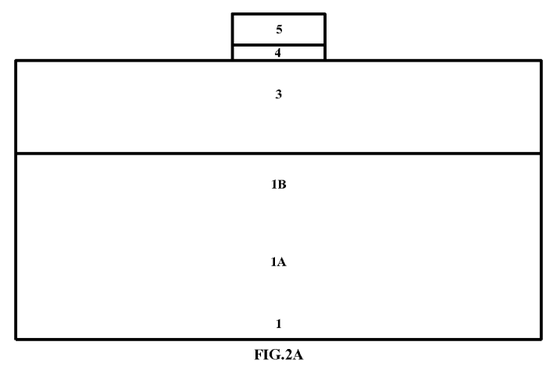
Figure 2B:
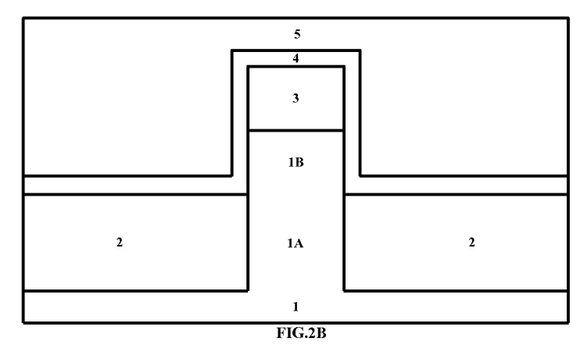

Referring to FIG. 2A and FIG. 2B, a plurality of dummy gate stack structures extending along a second direction are formed, wherein the second direction intersects with the first direction, preferably perpendicular (orthogonal) to the first direction, such that each of the plurality of dummy gate stack structures overlaps and encloses a part of the at least one fin structure, that is, the part of fin trench 1B on STIs 2. First, a pad oxide layer 4 is formed by deposition on the entire device by a process such as LPCVD, PECVD, HDPCVD, RTO, and chemical oxidation, then a dummy gate layer 5 is formed on the gate insulating layer 3 by a deposition process such as PECVD, HDPCVD, MOCVD, MBE, ALD, evaporation, and sputtering, and is planarized by chemical mechanical polishing (CMP) subsequently, thus the dummy gate layer 5 overlaps (the top surface and the sides of) the pad oxide layer 4 and (the top surface of) STIs 2. The dummy gate layer 5 may be made of one of polysilicon, amorphous silicon, microcrystalline silicon, amorphous carbon, poly-germanium and amorphous germanium, or combinations thereof. Finally, the dummy gate layer 5 and the pad oxide layer 4 are performed photolithography/etching (along a first direction) to remove the laminated layers of the dummy gate layer 5 and the pad oxide layer 4 that correspond to the area outside the channel to be formed, and the retained dummy gate layer 5 and pad oxide layer 4 overlap and enclose the fin 1B and the top surface and two sides of the hard mask layer 3 along a second direction, only leaving a plurality of dummy gate stack structures 5/4 extending along a second direction (which intersects with the first direction and is preferably perpendicular thereto) at locations corresponding to at least one channel region to be formed (which may be a plurality of channel regions that mutually parallel to each other). Wherein the part of each fin structure (fin channel 1B) on both sides of the dummy gate stack structures 5/4 (along a first direction) will correspond to the source and drain regions, and the part of each fin structure that is enclosed by the dummy gate stack structures 5/4 will constitute a channel region.

Figure 3A:
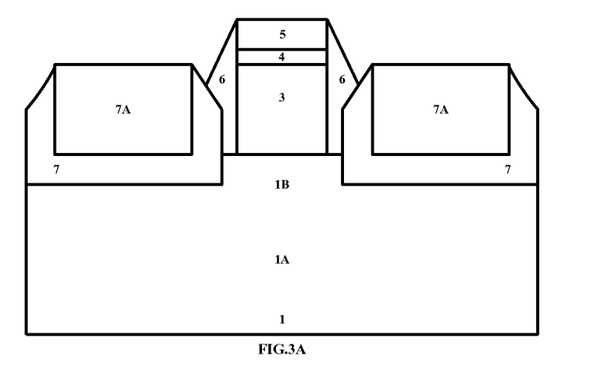
Figure 3B:
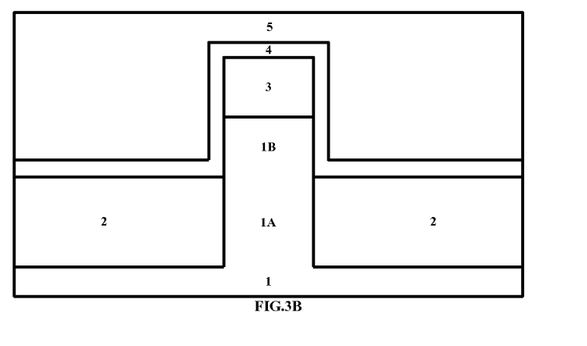

Referring to FIG. 3A and FIG. 3B, the at least one fin structure on both sides of the dummy gate stack structures is etched to form source and drain regions.

The dummy gate stack structures 5/4 and the hard mask layer 3 below are etched to form lines extending along a second direction, then gate spacers 6 are formed on both sides of each of the dummy gate stack structures 5/4 (along a first direction), the material thereof is different from that of the dummy gate layer 5, the hard mask layer 3, and the fin structure(s) 1B, and may be made of, e.g., one of silicon nitride, silicon oxynitride, amorphous carbon and DLC, or combinations thereof.

Dry etching, e.g., fluoro-based, chlorine-based, and oxygen-based (reaction) plasma etching, or wet etching adopting etchant such as TMAH (for Si) and a combination of strong acid/strong oxidant (for compound semiconductors such as SiGe) is performed to the fin structure(s) 1B on both sides of the dummy gate stack structures 5/4 to form source and drain trenches (not shown). Then, stress layers are epitaxially grown in the source and drain trenches, that is, embedded stress layers 7 are epitaxially grown in the source and drain trenches by an epitaxial growth process such as UHVCVD, MOCVD, ALD, MBE, and atmospheric pressure epitaxy. Wherein, as for different types of MOSFETs, the materials for the stress layers 7 may be not the same. For example, as for a PMOS, the stress layers 7 may be made of one of SiGe, SiSn and GeSn, or combinations thereof, to thereby apply a compressive stress to the channel regions 1C, so as to enhance the hole mobility; while as for a NMOS, the stress layers 7 may be made of one of Si:C, Si:H and SiGe:C or combinations thereof. Moreover, the stress layers 7 shall be made of a Si alloy material different from that of the fin channel 1B. Wherein, as shown in FIG. 3A, the top of the stress layers 7 is higher than the fin channel region(s) 1B/channel region(s) 1C (thus constitute a raised source-drain to reduce the contact resistance effectively) and is lower than the dummy gate layer 5, such a configuration is only for the purpose of illustration, so the top height difference may be arbitrarily set.

Preferably, in-situ doping may be performed when the stress layers 7 are epitaxially formed, so that the conductivity type of the stress layers 7 may be adjusted depending on the type of the MOSFET, e.g., as for a NMOS, P, As, and Sb etc. may be doped, as for a PMOS, B, Al, Ga and In etc. may be doped. Furthermore, the time point for adding the dopant may be controlled while performing in-situ doping in the epitaxial growth such that the doping concentration of the stress layers 7 close to the bottom of the fin channel(s) 1B is lower than that close to the top of the fin channel(s) 1B, for example, no in-situ doping is performed at the bottom of the stress layers 7, only a compressive stress is applied thereto, and in-situ doping is performed at the top of the stress layers 7 to form source and drain regions 7A. Moreover, ion doping implantation may also be performed after epitaxially growing the stress layers 7 (implanting ions is the same as in-situ doping) to form source and drain regions 7A, while no doping is performed in the area of regions 7 within the channel regions.

Besides, in other embodiments of the present invention, the source and drain trenches and the stress layers may have a shape not limited to the near-rectangle and near-trapezoid as shown in FIG. 3A, but may be a Σ shape (having a concave toward the channel region along a first direction), a (inverted) trapezoid or a triangle, and may also be a curve, a curved surface, e.g., a C shape (the side surface of the side of the trench toward the channel region is a circular shape, an elliptical shape, and a sector etc. (greater than or equal to a half)) or a D shape (the side surface of the side of the trench toward the channel region is a semicircular shape or a semi-elliptical shape).

In other embodiments of the present invention, the method for performing etching to form the source and drain trenches may be: first performing dry etching and then performing wet etching, performing individual dry etching or wet etching (to obtain a concave toward the channel region by adjusting the etching process parameter), or performing one-time (or two-time) etching by an isotropic dry etching process using CF-based etching gases to form C shape or D shape trenches.

Figure 4A:
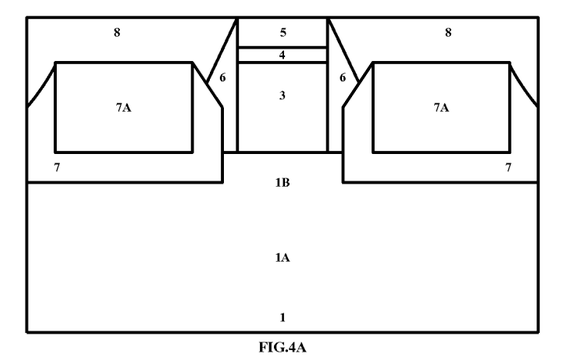
Figure 4B:
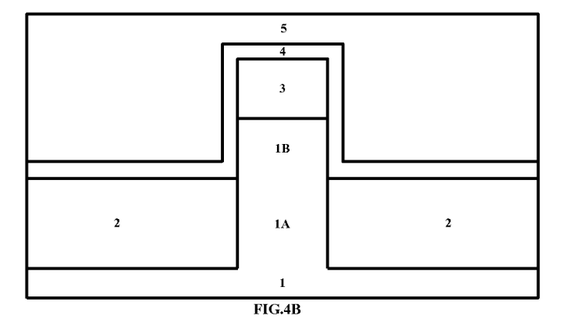

Referring to FIG. 4A and FIG. 4B, an interlayer dielectric layer is formed which at least overlapp the at least one fin along a first direction and is planarized to expose the dummy gate layer. An interlayer dielectric layer (ILD) 8 is formed on the entire device by a process such as spin coating, spray coating, and screen-printing, the material thereof may be one of silicon oxide, silicon oxynitride and low-K materials including but not limited to organic low-K materials (aryl-containing or polycyclic organic polymer), inorganic low-K materials (e.g., amorphous carbon nitride thin films, polycrystalline boron nitride thin films, fluorosilicate glass, BSG, PSG, BPSG), and porous low-K materials (e.g., Silsesquioxane (SSQ)-based porous low-K materials, porous silicon dioxide, porous SiOCH, C-doped silicon dioxide, F-doped porous amorphous carbon, porous diamond, porous organic polymer). Thereafter, the ILD 8 is planarized by a conventional process such as CMP and etch back to expose the dummy gate layer 5.

Figure 5A:
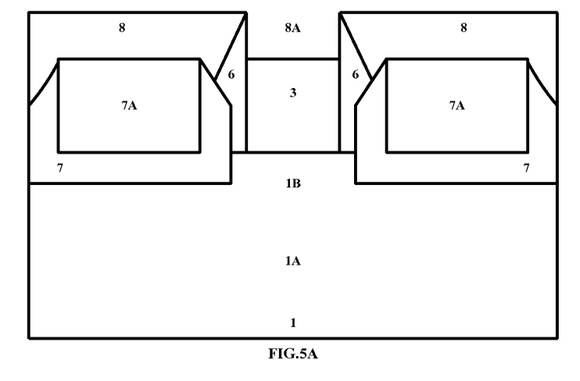
Figure 5B:
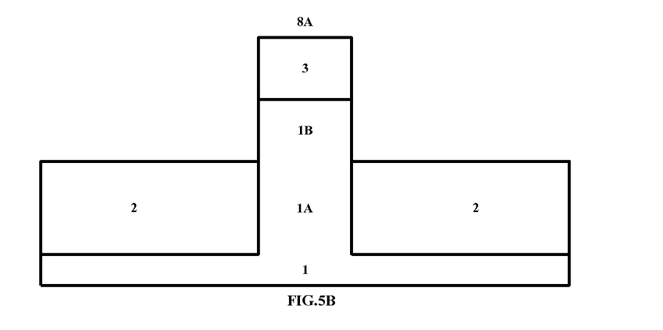

Referring to FIG. 5A and FIG. 5B, the dummy gate stack structures are removed by etching to form first gate trenches in the ILD. For different materials of the dummy gate layer 5 and the pad oxide layer 4, an appropriate etching process may be selected to remove the dummy gate stack structures 5/4 completely, thus forming first gate trenches 8A in the ILD 8 and exposing the hard mask layer 3. The etching process may comprise, e.g., removing the dummy gate layer 5 made of Si-based materials such as polysilicon and amorphous silicon by TMAH wet etching and removing the pad oxide layer 4 made of silicon oxide by using HF-based etchant or by dry etching using CF-based plasma.

Figure 6A:
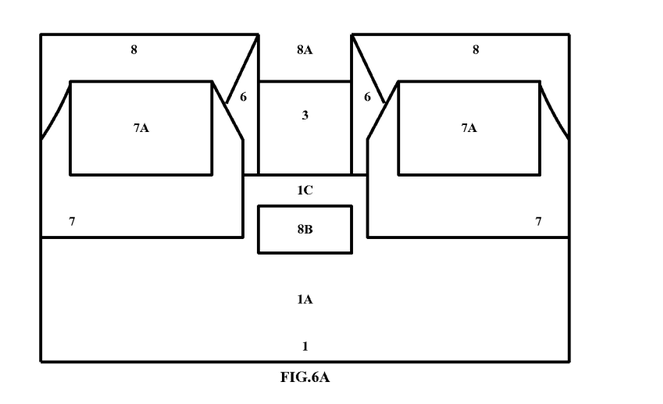
Figure 6B:
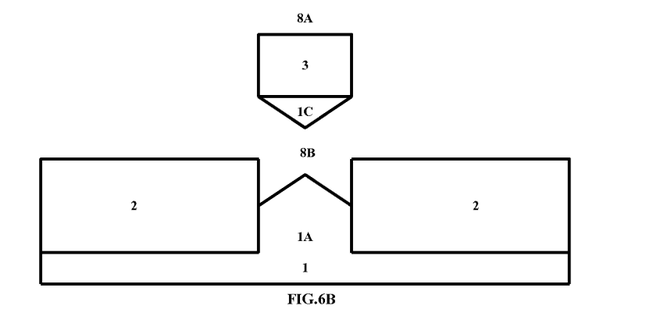

Referring to FIG. 6A and FIG. 6B, the at least one fin structure is etched along a second direction to form a plurality of punch-through second gate trenches 8B below the hard mask layer 3. For example, each fin 1B made of Si-based materials is etched by TMAH wet etching to form a second gate trench 8B below the hard mask layer 3. Wherein the retained part of the fin channel 1B below the second gate trench 8B forms a channel region 1C, and the second gate trench 8B will be connected with the first gate trench 8A above the hard mask layer 3 in a direction perpendicular to the top surface of the substrate such that the gate trench 8A/8B totally encloses the corresponding channel region 1C. Furthermore, the second gate trench may have a shape not limited to Σ (having a concave toward the channel region along a first direction and consisting of fold lines of many segments), (inverted) trapezoid (with the short base toward the channel region) or a triangle (that is, the channel region 1C is substantially connected with the retained fin channel 1B below, and the trench 8B only punches through a very small part in FIG. 6A) as shown in FIG. 6A, and may also be a curve, a curved surface, e.g., a C shape (the side surface of the side of the trench toward the channel region is a circular shape, an elliptical shape, and a sector etc. (greater than or equal to a half)) or a D shape (the side surface of the side of the trench toward the channel region is a circular shape, an elliptical shape, and a sector etc. (smaller than or equal to a half)). Here, because the channel region 1C is processed by further etching based on the fin channel 1B whose own lines are rather small, generally its size is below 20 nm, even below 10 nm, accordingly they may be deemed or be called as nanolines, that is, the nanolines constitute the channel region.

Figure 7A:
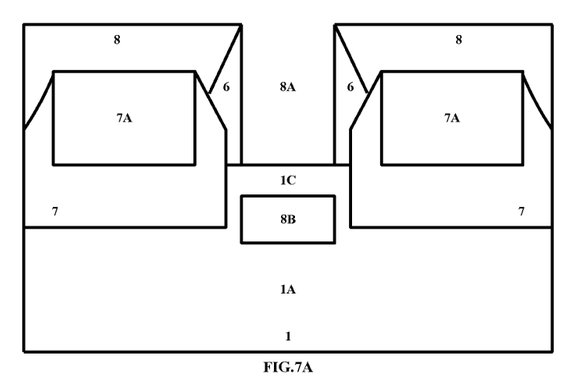
Figure 7B:
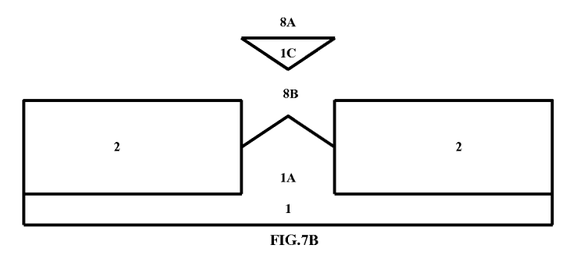

Referring to FIG. 7A and FIG. 7B, the hard mask layer 3 is removed by etching. The hard mask layer 3 made of a material such as silicon nitride and silicon oxynitride is removed by using hot phosphoric acid, or a combination of strong oxidant and strong acid (e.g, sulphuric acid+hydrogen peroxide) such that the two gate trenches 8A and 8B in FIGS. 6A and 6B are further connected to enclose the corresponding channel region 1C of nanolines completely.

Referring to FIG. 8A and FIG. 8B, a plurality of gate stack structures 9A/9B are formed in the gate trenches 8A/8B. A gate insulating layer 9A is deposited by a process such as PECVD, HDPCVD, MOCVD, MBE, and ALD, and the material thereof may be one of silicon oxide, N-doped silicon oxide and silicon nitride, or other high-K materials including but not limited to Hf-based materials selected from $HfO_2$, $HfSiO_x$, HfSiON, $HfAlO_x$, $HffaO_x$, $HfLaO_x$, $HfAlSiO_x$, and $HfLaSiO_x$, (wherein the content of oxygen atom x for the materials may be reasonably adjusted, e.g., may be 1~6 and may not be limited to an integer depending on the multielement metal component ratio and different chemical valence), rare earth based high-K materials selected from $ZrO_2$, $La_2O_3$, $LaAlO_3$, $TiO_2$, and $Y_2O_3$, $Al_2O_3$, or a composite layer of the above materials. A gate conductive layer 9B is deposited by a process such as PECVD, MOCVD, MBE, ALD, evaporation, and sputtering, the material thereof may be polysilicon, polycrystalline silicon germanium or metal, wherein the metal may comprise metal element such as Co, Ni, Cu, Al, Pd, Pt, Ru, Re, Mo, Ta, Ti, Hf, Zr, W, Ir, Eu, Nd, Er, and La, alloy of these metal, or nitride of these metal, and the gate conductive layer 9B may also be doped with elements such as C, F, N, O, B, P, and As to adjust the work function. A block layer formed of nitride (not shown) is preferably formed between the gate conductive layer 9B and the gate insulating layer 9A by a conventional process such as PVD, CVD, and ALD, the material thereof may be one of $M_xN_y$, $M_xSi_yN_z$, $M_xAl_yN_z$ and $M_aAl_xSi_yN_z$, wherein M is one of Ta, Ti, Hf, Zr, Mo and W or other elements.

Thereafter, the device is continuously manufactured by using the existing processess. For example, the ILD 8 is etched to form source and drain contact holes (not shown); a metal layer (not shown) is formed in the source and drain contact holes by a process such as evaporation, sputtering, and MOCVD, and the material thereof may be, e.g., one of Ni, Pt, Co, Ti, and Ge, or combinations thereof, then high temperature annealing is performed under 550~850° C. to form a metal silicide and the unreacted metal layer is removed, leaving a silicide layer (not shown) in the contact holes in the source and drain regions 7A, the material thereof may be, e.g., $CoSi_2$, $TiSi_2$, NiSi, PtSi, NiPtSi, CoGeSi, TiGeSi, and NiGeSi so as to reduce the source and drain contact resistance; and metal or metal nitride is filled in the contact holes to form source and drain contact plugs, and so on.

The finally formed device structure is as shown in FIG. 9, comprising a plurality of fins extending along a first direction (fin channel 1B and fin substrate 1A), a plurality of metal gates 9B extending along a second direction (which intersects with and is preferably perpendicular to the first direction) and across each of the fins, a plurality of stress layers 7 on the fins on both sides of the metal gates and source and drain regions 7A in the stress layers, a plurality of channel regions 1C between a plurality of source and drain regions, wherein the metal gates 9B enclose the channel regions 1C. The materials and the geometric shapes of these structures have been described in detail in the disclosure of method, thus no more unnecessary details will be provided here.

In accordance with the semiconductor device and the method of manufacturing the same of the present invention, an all-around nanowire metal multi-gate is formed by a self-aligned process by punching through and etching the fins at which the channel regions are located using a combination of the hard mask and the dummy gate, thus the device performance is enhanced.

Although the present invention has been described with reference to one or more illustrative embodiments, it may be appreciated by those skilled in the art that various appropriate modifications and equivalents can be made to the device structure without departing from the scope of the present invention. Besides, many modifications adaptable to specific situations or materials can be made under the disclosed teaching without departing from the scope of the present invention. Therefore, it is not intended to limit the present invention to the specific embodiments which are disclosed as the preferred embodiments for implementing the present invention, the disclosed device structure and the manufacturing method thereof will include all the embodiments that come within the scope of the present invention.

What is claimed is:

1. A method of manufacturing a semiconductor device, comprising:
    forming a plurality of fins extending along a first direction on a substrate and a hard mask layer over the fins;
    forming a plurality of dummy gate stack structures extending along a second direction and across each of the fins;
    forming stress layers in the fins on both sides of the dummy gate stack structures and source and drain regions in the stress layers;
    depositing an interlayer dielectric layer to overlap the fins, the stress layers, and the dummy gate stack structures;
    removing the dummy gate stack structures, thereby forming first gate trenches in the interlayer dielectric layer to expose the hard mask layer;
    etching the fins below the hard mask layer to form second gate trenches, wherein the fins between the second gate trenches and the hard mask layer form a plurality of channel regions; and
    performing a deposition in the first and second gate trenches to form a plurality of gate stack structures that enclose the plurality of channel regions.

2. The method of manufacturing a semiconductor device according to claim 1, wherein the material for the fins is different from that for the stress layers.

3. The method of manufacturing a semiconductor device according to claim 2, wherein the fins are made of a material selected from Si, SiGe, SiSn, GeSn, Si:C, Si:H and SiGe:C, or combinations thereof, and the stress layers are made of a Si alloy material selected from SiGE, SiSn, GeSn, Si:C, Si:H and SiGe:C, or combinations thereof.

4. The method of manufacturing a semiconductor device according to claim 1, wherein each of the gate stack structures comprise a gate insulating layer formed of high-K materials and a gate conductive layer formed of metallic materials.

5. The method of manufacturing a semiconductor device according to claim 1, wherein the second gate trenches have a sectional shape of one of Σ, C, and D or combinations thereof along a second direction.

6. The method of manufacturing a semiconductor device according to claim 1, wherein the stress layers and/or the source and drain regions comprise one of SiGe, SiSn, GeSn, Si:C, Si:H and SiGe:C, or combinations thereof.

7. The method of manufacturing a semiconductor device according to claim 1, wherein after forming the second gate trenches, the method further comprises: performing etching to remove the hard mask layer.

8. The method of manufacturing a semiconductor device according to claim 1, wherein each of the dummy gate stack structures comprises a pad oxide layer and a dummy gate layer.

9. The method of manufacturing a semiconductor device according to claim 1, wherein the step of forming stress layers and source and drain regions therein further comprises:
    forming gate spacers on the fins on both sides of the dummy gate stack structures along a first direction;
    performing etching in the fins on both sides of the gate spacers to form source and drain trenches;
    performing an epitaxial deposition in the source and drain trenches to form stress layers; and
    performing doping to form source and drain regions in the stress layers, while or after forming the stress layers.

* * * * *